United States Patent [19]
Grondahl

[11] Patent Number: 5,936,464
[45] Date of Patent: Aug. 10, 1999

[54] METHOD AND APPARATUS FOR REDUCING DISTORTION IN A HIGH EFFICIENCY POWER AMPLIFIER

[75] Inventor: Christopher David Grondahl, Chandler, Ariz.

[73] Assignee: Motorola, Inc., Schaumburg, Ill.

[21] Appl. No.: 08/962,731

[22] Filed: Nov. 3, 1997

[51] Int. Cl.$^6$ ....................................................... H03F 3/38
[52] U.S. Cl. ............................................. 330/10; 330/136
[58] Field of Search .............................. 330/10, 129, 136, 330/149, 207 A, 251, 277

[56] References Cited

U.S. PATENT DOCUMENTS

| | | | |
|---|---|---|---|
| 4,465,980 | 8/1984 | Huang et al. | 330/136 X |
| 5,251,330 | 10/1993 | Chiba et al. | 455/91 |
| 5,831,475 | 11/1998 | Myers et al. | 330/10 |

OTHER PUBLICATIONS

An article entitled "High–Efficiency Single–Sideband HF/VHF Transmitter Based Upon Envelope Elimination And Restoration" by F.H. Raab and D.J. Rupp, Green Mountain Radio Research Company, USA from IEEE CP392, UK pp. 21–25, Jul. 4–7, 1994.

An article entitled "Class–S High–Efficiency Amplitude Modulator" by Dr. Frederick H. Raab and D.J. Ruppp, Green Mountain Radio Research from GMRR TP93–1:RF Design, vol. 17, No. 5, pp. 70–74, May 1994.

An article entitled "Single–Sideband Transmission By Envelope Elimination and Restoration" by Leonard R. Kahn from Proceedings Of The IRE.

*Primary Examiner*—Steven J. Mottola
*Attorney, Agent, or Firm*—Dana B. LeMoine

[57] ABSTRACT

A method and apparatus for efficient power amplification of a wideband signal with a correspondingly wide modulation bandwidth includes an envelope detector (220), an envelope amplifier (270), a driver amplifier (250), and a power amplifier (260). The driver amplifier (250) includes a dual gate variable gain amplifier (252) that has a substantially constant phase characteristic over a wide dynamic range. The power amplifier (260) is modulated by an amplified envelope signal from the envelope amplifier (270), and is driven by an output of the driver amplifier (250). The operation of the cascaded driver amplifier (250) and power amplifier (260) allow the power amplifier (260) to operate a substantially constant compression point, and reduced distortion.

15 Claims, 3 Drawing Sheets

METHOD AND APPARATUS FOR REDUCING DISTORTION IN A HIGH EFFICIENCY POWER AMPLIFIER

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many modulated signals include information in the amplitude envelope and the phase of the signal, a premium is placed on the ability to create a high fidelity reproduction of the signal. In particular, the amplifier preferably exhibits very low amplitude distortion and very low phase distortion.

Communications devices, which often transmit signals having information in both amplitude and phase, are an example application where these qualities are in demand. Low distortion allows the communications devices to communicate more reliably, and high efficiency allows the devices to operate longer on a single battery.

One method of achieving increased efficiency is to use saturating amplifiers. Saturating amplifiers, such as class C amplifiers, achieve the goal of high efficiency at the expense of nonlinearity. Nonlinear amplifiers, however, cannot be used in applications where information is included in the amplitude envelope because that information is corrupted by the nonlinear amplification. When amplitude information has been corrupted by a nonlinear amplifier, amplitude distortion has occurred.

Further, when power amplifiers are driven with high level input signals, a nonlinear phase response results. However, once again, amplifiers with nonlinear phase response cannot be used in applications where information is included in the phase, because that information is corrupted by the nonlinear phase response, resulting in phase distortion and loss of information.

In addition to distortion and loss of information, nonlinear operation of saturated amplifiers causes an increase in intermodulation products. Intermodulation products cause undesirable amounts of energy to be present in frequency bands other than the one intended for use. This undesirable energy is commonly quantified and termed Adjacent Channel Power (ACP). Excessively high levels of ACP can cause an amplifier to be unsuitable for a particular application.

Since efficiency has traditionally been gained by driving amplifiers into saturation, and since driving amplifiers into saturation causes intermodulation products to rise, high efficiency and low intermodulation products have historically been traded off against each other. It would be very desirable to achieve low intermodulation products in a highly efficient saturating amplifier, thereby obviating the need for a trade-off between the two.

Accordingly, there is a need for a high efficiency saturating amplifier with a linear amplitude response and resulting low amplitude distortion. There is also a significant need for a high efficiency linear power amplifier with reduced phase distortion. There is also a need for a high efficiency saturating amplifier that exhibits low intermodulation products.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an apparatus and method for reducing distortion in high efficiency linear power amplifiers. It is to be understood that many of the specific details of any particular exemplary embodiment are disclosed herein to satisfy the best mode requirement and do not in any way limit the scope of the invention.

Figure 1:
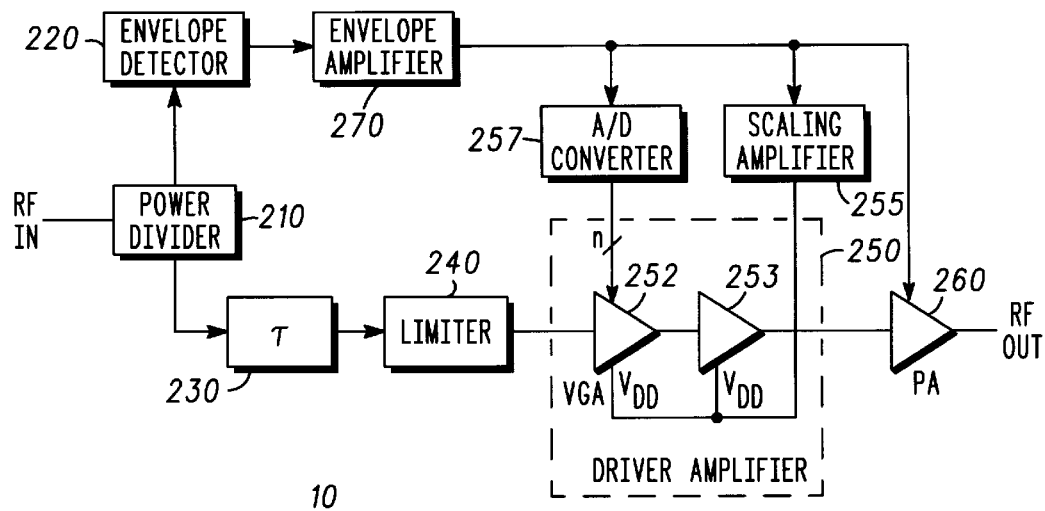
FIG. 1 shows a diagram of an amplifier in accordance with a preferred embodiment of the present invention.

FIG. 1 shows a diagram of an amplifier in accordance with a preferred embodiment of the present invention. Envelope Elimination and Restoration (EER) is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

EER-type amplifier 10 includes power divider 210, envelope detector 220, envelope amplifier 270, time delay element 230, limiter 240, driver amplifier 250, scaling amplifier 255, analog to digital converter (A/D) 257, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240, driver amplifier 250, and power amplifier 260. Time delay element 230, which produces a delay equal to that introduced by envelope amplifier 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is then input to driver amplifier 250 which, in turn, drives power amplifier 260.

Driver amplifier 250 and power amplifier 260 are amplifier stages capable of being modulated, and are preferably field effect transistor (FET) amplifiers. The drains of the FET amplifiers are conventionally connected to a DC power source; however, as will be discussed below, in a preferred embodiment exemplified herein, the drains of the FET amplifiers are driven with signals, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

Figure 6:
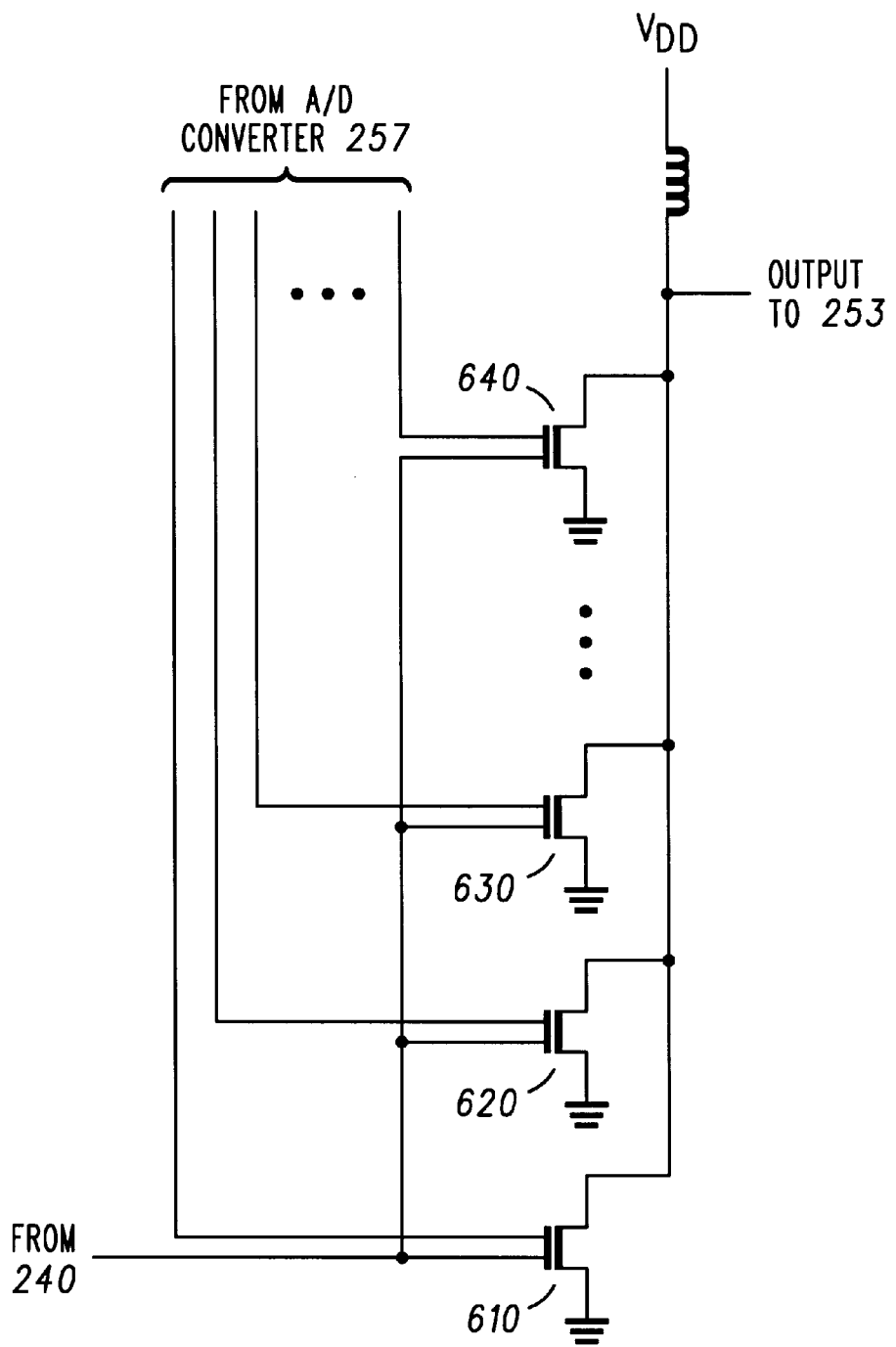
FIG. 6 shows a dual gate variable gain amplifier in accordance with a preferred embodiment of the present invention.

Driver amplifier 250 includes dual gate variable amplifier (VGA) 252 and amplifier stage 253. The gain of VGA 252 is controlled by a digital word output from A/D 257. The phase error contributed by VGA 252 is minimal because the dual gate variable gain amplifier has consistent phase characteristics over a wide range of gain settings. The dual gate variable gain amplifier of the present invention is preferably an integrated semiconductor circuit such as in a monolithic microwave integrated circuit (MMIC). FIG. 6 shows a dual gate variable gain amplifier in accordance with a preferred embodiment of the present invention. The dual gate variable gain amplifier 252 preferably includes several cascode amplifiers 610–640 connected in parallel, with the cascode amplifiers being tightly spaced and sharing the same active region on the integrated circuit. The peripheries of the cascode amplifiers are scaled in a binary fashion (e.g., 100 $\mu$m, 50 $\mu$m, 25 $\mu$m, and 12.5 $\mu$m for a total periphery of 187.5 $\mu$m). The binary control word controlling the gain of VGA 252 turns on the sections, i.e. peripheries, required for the desired gain. The gain of VGA 252 increases with the number of periphery turned on. The cascode amplifier arrangement causes the parasitics of the dual gate variable gain amplifier to remain substantially constant over the various gain settings, thereby causing the phase to remain substantially constant.

Within driver amplifier 250, gain is controlled by a digital word output from A/D 257. In addition, scaling amplifier 255 provides a signal proportional to the envelope that is used to drive the gain bias of VGA 252 and amplifier stage 253.

The amplitude path of EER-type amplifier 10 includes envelope detector 220 and envelope amplifier 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used.

Envelope amplifier 270 amplifies the envelope signal output from envelope detector 220 and drives the drain bias of power amplifier 260. Envelope amplifier 270 amplifies the envelope signal to a level commensurate with the desired output. The output of envelope amplifier 270 is the power supply for power amplifier 260, and the resultant remodulation of the phase modulated carrier restores the envelope, producing an amplified replica of the input signal. The amplified envelope signal varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

In the EER-type amplifier of FIG. 1 it is desirable to reduce phase distortion as much as possible, and in particular, it is desirable to reduce any phase distortion introduced by power amplifier 260. The present invention provides such a strategy for reducing the phase distortion in the power amplifier 260.

In EER-type amplifiers, efficiency is gained by operating the final power amplifier at or near saturation. When operating at or near saturation, the amplifier is operating at a region of compression, where as drive levels change, the phase of the output also changes. In conventional EER-type amplifiers, the input level to the final power amplifier is substantially constant while the amplifier is modulated by the envelope signal. Even though the amplifier is constantly at or near saturation, the compression point is changing as the drain bias is changed. A preferred embodiment of the present invention provides a strategy for minimizing phase errors in power amplifier 260 which are a function of, among other things, changes in the compression point. In a preferred embodiment as exemplified in FIG. 1, power amplifier 260 is operated at a substantially constant compression point thus minimizing phase error contributions from the final power amplifier.

By driving power amplifier 260 with dual gate variable gain amplifier 252, and by adjusting the gain of dual gate variable gain amplifier 252 as a function of the amplified envelope, the relationship between the input to power amplifier 260 and the drain bias of power amplifier 260 are maintained such that power amplifier 260 is operated at a substantially constant compression point. Phase error contributed by dual gate variable gain amplifier 252 is minimal because dual gate variable gain amplifier 252 has substantially constant phase over a wide range of gain settings.

The embodiment of the present invention as shown in FIG. 1 also provides a method and apparatus for drain bias predistortion in driver amplifier 250. Scaling amplifier 255 scales the amplified envelope signal and drives the drain bias of dual gate variable gain amplifier 252. In operation, the drain bias is driven in such a fashion as to predistort the output of driver amplifier 250 to further reduce the effects of phase distortion introduced by the amplifier chain in the envelope path. The drain bias signal for driver amplifier 250 causes the output of driver amplifier 250 to be distorted in response to the envelope of the original input signal. In a preferred embodiment, the distortion in driver amplifier 250 as a result of the gate bias signal reduces the remaining distortion present in the driver amplifier chain. Through the predistortion and the operation of dual gate variable gain amplifier 252, the resulting output signal is a high fidelity reproduction of the input signal.

Figure 2:
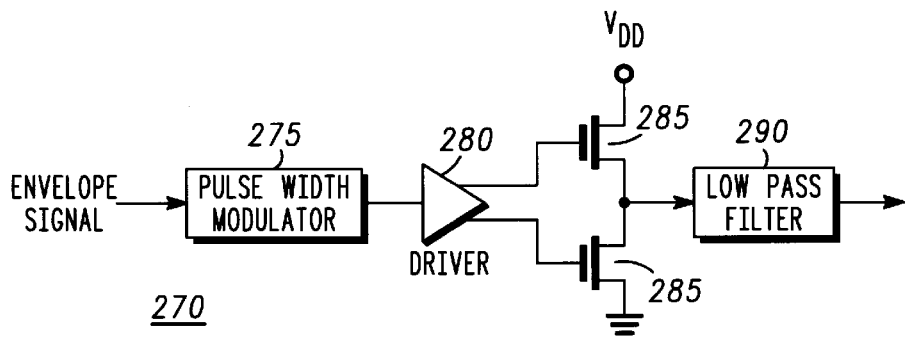
FIG. 2 shows a diagram of a envelope amplifier in accordance with a preferred embodiment of the present invention.

FIG. 2 shows a diagram of an envelope amplifier in accordance with a preferred embodiment of the present invention. Envelope amplifier 270 includes pulsewidth modulator (PWM) 275, driver 280, switching transistors 285, and low pass filter 290.

PWM 275 receives the input to envelope amplifier 270. The input to envelope amplifier 270 is the envelope signal generated by envelope detector 220 (FIG. 1). PWM 275 performs pulsewidth modulation of the envelope signal to produce a pulsewidth modulated signal which has a duty cycle proportional to the amplitude of the envelope signal. The pulsewidth modulated signal is then fed to driver 280. Switching transistors 285 and low pass filter 290, in response to driver 280, produce a signal that is an amplified version of the output of envelope detector 220 (FIG. 1).

Figure 3:
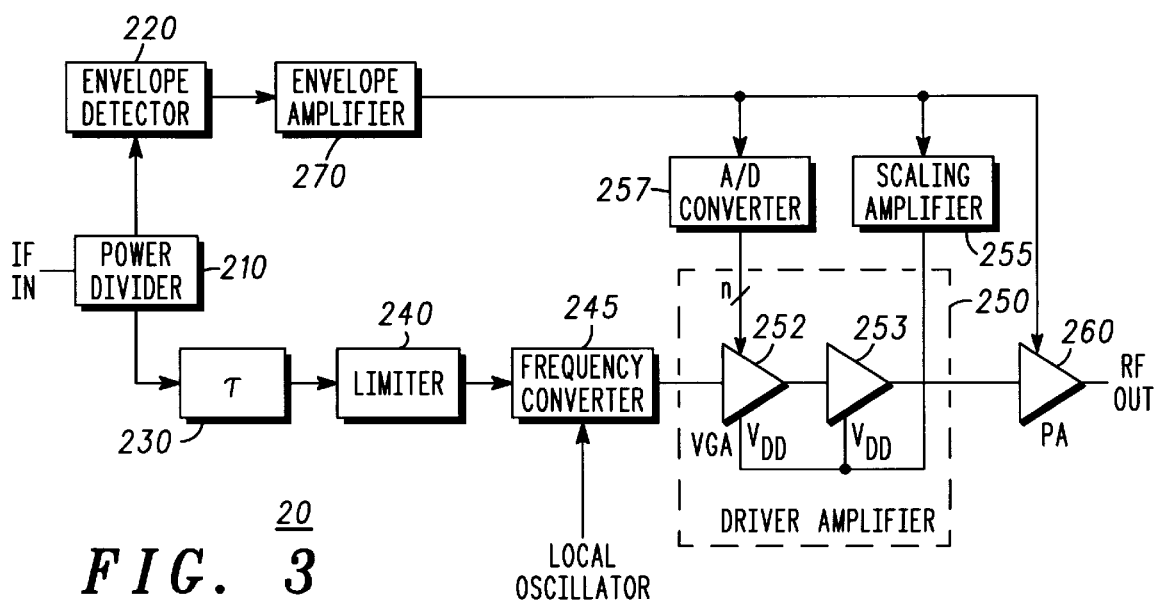
FIG. 3 shows an amplifier in accordance with an alternate embodiment of the present invention.

FIG. 3 shows an amplifier in accordance with an alternate embodiment of the present invention. In FIG. 3 an IF signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and envelope amplifier 270. These elements correspond to the elements of FIG. 1 which have like names and like reference numbers. In addition, envelope amplifier 270 corresponds to envelope amplifier 270 of FIG. 1, which was discussed in detail previously in connection with FIG. 2.

The phase path of EER-type amplifier 20 includes time delay element 230, limiter 240, frequency converter 245, driver amplifier 250, and power amplifier 260. Time delay element 230, limiter 240, driver amplifier 250, and power amplifier 260 correspond to the elements shown in FIG. 1 with like names and like reference numbers. In contrast to the embodiment shown in FIG. 1, the alternate embodiment of FIG. 3 includes frequency converter 245 in the phase path. Frequency converter 245 receives the signal in the phase path and also receives a local oscillator (LO) signal. Frequency converter 245 converts the frequency of the carrier signal to its final RF frequency using circuitry well known in the art, such as a mixer. The resulting signal is then used to drive driver amplifier 250, which in turn, drives power amplifier 260 which operates at the final RF frequency.

Because of the operation of frequency converter 245, the amplifier of FIG. 3 takes in a signal at a frequency different from the final RF frequency. FIG. 3 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 3, the input signal can be at any frequency different from the RF frequency.

In this circuit arrangement, with frequency converter 245 being an integral part of the amplifier, the amplifier becomes more tightly integrated with the device that houses the amplifier. Tighter integration results in smaller, lower power devices, which are easier to manufacture.

Figure 4:
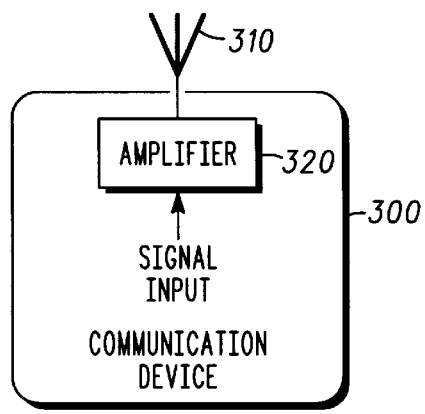
FIG. 4 shows a diagram of a communications device in accordance with a preferred embodiment of the present invention.

FIG. 4 shows a diagram of a communications device in accordance with a preferred embodiment of the present invention. Communications device 300 includes amplifier 320 and antenna 310. Amplifier 320 may comprise any of the amplifiers of the present invention, including for example, EER-type amplifier 10 (FIG. 1), envelope amplifier 270 (FIG. 2), or EER-type amplifier 20 (FIG. 3). Communications device 300 may be one of many different devices capable of communications. Examples include, but are not limited to, subscriber units in a communications system, radio receivers, transmitters, and transceivers, one-way and two-way pagers, and cellular phones.

Figure 5:
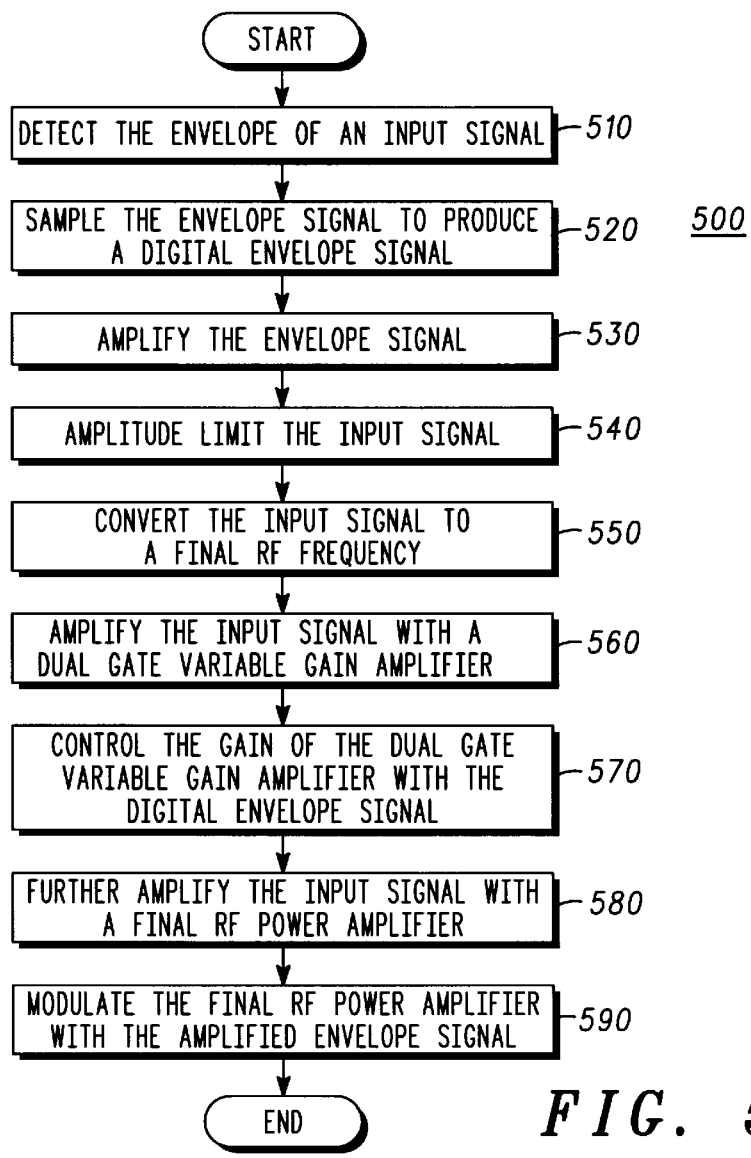
FIG. 5 shows a flow chart for a method of amplifying a signal in accordance with a preferred embodiment of the present invention.

FIG. 5 shows a flow chart for a method of amplifying a signal in accordance with a preferred embodiment of the present invention. In step 510 an input signal is envelope detected to produce an envelope signal. The envelope signal includes the information originally included in the amplitude of the signal input to the amplifier. The envelope of the input signal can be detected in step 510 by a number of possible methods. A diode detector can be used as well as other well known methods, including the use of a synchronous detector based on a double balanced mixer.

After the envelope is detected in step 510, the envelope signal is sampled in step 520. After sampling, a digital envelope signal exists. In step 530 the envelope signal which was generated in step 510 is amplified. The envelope signal is preferably amplified with a high efficiency amplifier such as a class S modulator. In step 540 the input signal is amplitude limited to produce a phase modulated carrier. The phase modulated carrier is preferably an amplitude limited signal including the phase information from the original input signal. Then in step 550 the signal in the phase path is converted to a desired frequency for transmission. One skilled in the art will understand that step 550 is only necessary if the input signal is of a different frequency than the desired RF output signal.

Then in step 560 the phase modulated carrier is amplified with a dual gate variable gain amplifier. As previously discussed, dual gate variable gain amplifiers have a substantially linear phase characteristic over a wide range of gain settings. In step 570 the gain of the dual gate variable gain amplifier is controlled with the digital envelope signal. In this manner, the dual gate variable gain amplifier amplifies the phase modulated carrier with a substantially linear phase characteristic. After the phase modulated carrier is amplified by the dual gate variable gain amplifier, it is amplified by the final RF power amplifier in step 580.

Finally, in step 590, the final RF power amplifier is modulated with the amplified envelope signal which was generated in step 530. It is desirable to recombine the amplitude of the signal with the phase of the signal after each has undergone a similar delay. Depending on the circuit elements used in amplifying the envelope signal and in amplifying the phase modulated carrier, a time delay may be necessary in one or more signal paths in order to time align the recombination of the amplitude and phase.

The use of a dual gate variable gain amplifier along with a final power amplifier that is modulated by the envelope provides for a substantially linear phase characteristic for the amplifier chain as a whole. In addition to the above mentioned steps, the dual gate variable gain amplifier can be modulated with a version of the amplified envelope signal much in the same way as the final RF power amplifier.

Because the final RF power amplifier is modulated with a signal generated from the envelope of the input signal, and is driven by a signal which has also been amplified as a function of the envelope of the input signal, the final RF power amplifier operates at a substantially constant compression point and thereby exhibits a substantially linear phase response. As a result of the foregoing method, a high fidelity amplified reproduction of the input signal is created very efficiently.

In summary, the method and apparatus of the present invention provide a means for operating a saturating amplifier at full power with acceptably low intermodulation products. In addition, the method and apparatus of the present invention as described represent a versatile way of achieving low phase distortion in a high efficiency, linear power amplifier. Highly efficient linear amplifiers with low phase distortion are very useful in the amplification of modulated signals which include information in both amplitude and phase. Communications devices, which often transmit signals having information in both amplitude and phase, benefit greatly from the apparatus and method of the present invention. Low distortion allows the communications devices to communicate more reliably, and high efficiency allows the devices to operate longer on a single battery.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, multiple dual gate variable gain amplifiers could be cascaded within the driver amplifier to achieve a larger gain while maintaining a substantially linear phase response.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of reducing distortion in a power amplifier, said method comprising the steps of:

envelope detecting an input signal to produce an envelope signal;

producing a pulsewidth modulated signal with a duty cycle proportional to an amplitude of said envelope signal;

filtering said pulsewidth modulated signal to produce an amplified envelope signal;

sampling said amplified envelope signal to produce a digital envelope signal;

amplifying said input signal with a dual gate variable gain amplifier wherein a gain of said dual gate variable gain amplifier is controlled by said digital envelope signal; and further amplifying said input signal with a power amplifier stage wherein said power amplifier stage is modulated by said amplified envelope signal.

2. The method of claim 1 further comprising the step of:

after said envelope detecting step, delaying said input signal.

3. The method of claim 1 wherein said power amplifier stage is comprised of a field effect transistor having a drain bias input, and said drain bias input is driven by said amplified envelope signal.

4. The method of claim 1 further comprising the step of modulating said dual gate variable gain amplifier with said amplified envelope signal.

5. The method of claim 1 wherein said dual gate variable gain amplifier includes a drain bias input, and said drain bias input is driven by said amplified envelope signal.

6. The method of claim 1 further comprising the step of:

after said step of detecting, converting a frequency of said input signal to a final RF frequency.

7. The method of claim 1 further comprising the step of:

after said step of detecting, amplitude limiting said input signal.

8. A power amplifier with reduced phase distortion, said power amplifier comprising:

a driver amplifier stage having an input coupled to an input of said power amplifier, said driver amplifier stage being comprised of a dual gate variable gain amplifier;

an envelope detector for detecting an envelope of an input signal to produce an envelope signal;

an envelope amplifier coupled to said envelope detector, for producing an amplified envelope signal;

an analog to digital converter, responsive to said envelope signal, for controlling a gain of said dual gate variable gain amplifier; and a power amplifier stage having an input coupled to an output of said driver amplifier stage, and having an output coupled to an output of said power amplifier, wherein said power amplifier stage is modulated by said amplified envelope signal.

9. The power amplifier of claim 8 wherein said driver amplifier stage is modulated by said amplified envelope signal.

10. The power amplifier of claim 8 wherein said envelope amplifier comprises a class S modulator.

11. The power amplifier of claim 8 further comprising a frequency converter for converting said input signal to a final RF frequency.

12. A power amplifier circuit comprising:

means for creating an envelope signal from an input signal;

a dual gate variable gain amplifier for amplifying said input signal;

means, responsive to said envelope signal, for controlling a gain of said dual gate variable gain amplifier;

a final amplifier stage for further amplifying said input signal; and means, responsive to said envelope signal, for modulating said final amplifier stage.

13. The power amplifier circuit of claim 12 wherein said means for controlling a gain is comprised of an analog to digital converter.

14. The power amplifier circuit of claim 12 wherein said means for modulating comprises a class S modulator.

15. A communications device including a power amplifier circuit wherein said power amplifier circuit comprises:

a driver amplifier stage having an input coupled to an input of said power amplifier circuit, said driver amplifier stage being comprised of a dual gate variable gain amplifier;

an envelope detector, having an input coupled to said input of said power amplifier circuit, for producing an envelope signal;

an envelope amplifier coupled to said envelope detector, for producing an amplified envelope signal;

an analog to digital converter, responsive to said envelope signal, for controlling a gain of said dual gate variable gain amplifier; and a power amplifier stage having an input coupled to an output of said driver amplifier stage, and having an output coupled to an output of said power amplifier circuit, wherein said power amplifier stage is modulated by said amplified envelope signal.

* * * * *